(12) United States Patent
Pedersen

(10) Patent No.: US 10,042,587 B1
(45) Date of Patent: Aug. 7, 2018

(54) AUTOMATIC RESUMPTION OF SUSPENDED WRITE OPERATION UPON COMPLETION OF HIGHER PRIORITY WRITE OPERATION IN A MEMORY DEVICE

(71) Applicant: Adesto Technologies Corporation, Santa Clara, CA (US)

(72) Inventor: Bard M. Pedersen, Fremont, CA (US)

(73) Assignee: Adesto Technologies Corporation, Santa Clara, CA (US)

( * ) Notice: Subject to any disclaimer, the term of this patent is extended or adjusted under 35 U.S.C. 154(b) by 0 days.

(21) Appl. No.: 15/457,819

(22) Filed: Mar. 13, 2017

Related U.S. Application Data

(60) Provisional application No. 62/308,717, filed on Mar. 15, 2016.

(51) Int. Cl.
*G06F 3/06* (2006.01)

(52) U.S. Cl.
CPC .......... *G06F 3/0659* (2013.01); *G06F 3/0611* (2013.01); *G06F 3/0688* (2013.01)

(58) Field of Classification Search
CPC ..... G06F 3/0659; G06F 3/0611; G06F 3/0688
USPC ........................................................ 365/226
See application file for complete search history.

(56) References Cited

U.S. PATENT DOCUMENTS

| | | | |
|---|---|---|---|
| 6,192,002 B1 * | 2/2001 | Merritt | G11C 7/1072 365/189.04 |
| 7,562,180 B2 | 7/2009 | Gyl et al. | |
| 7,821,837 B2 | 10/2010 | Chun et al. | |
| 9,223,514 B2 | 12/2015 | Hyun et al. | |
| 2005/0058012 A1 * | 3/2005 | Yamauchi | G11C 7/10 365/233.1 |
| 2012/0179860 A1 | 7/2012 | Falanga et al. | |
| 2015/0043286 A1 * | 2/2015 | Hong | G11C 7/1087 365/189.05 |
| 2015/0380069 A1 * | 12/2015 | Matsui | G11C 11/4076 365/191 |
| 2016/0306553 A1 | 10/2016 | Ellis et al. | |

* cited by examiner

*Primary Examiner* — Harry W Byrne
(74) *Attorney, Agent, or Firm* — Michael C. Stephens, Jr.

(57) ABSTRACT

A memory device can include: a memory array comprising a plurality of memory cells; an interface configured to receive a suspend command and first and second write commands from a host, where the second write command is of higher priority and follows the first write command; a status register configured to store an automatic resume enable bit; a memory controller configured to suspend, in response to the suspend command, a first write operation that is executing the first write command on the memory array; the memory controller being configured to execute a second write operation on the memory array in response to the second write command; and the memory controller being configured to resume the first write operation upon completion of the second write operation in response to the automatic resume enable bit being set.

10 Claims, 7 Drawing Sheets

AUTOMATIC RESUMPTION OF SUSPENDED WRITE OPERATION UPON COMPLETION OF HIGHER PRIORITY WRITE OPERATION IN A MEMORY DEVICE

RELATED APPLICATIONS

This application claims the benefit of U.S. Provisional Application No. 62/308,717, filed Mar. 15, 2016, and which is incorporated herein by reference in its entirety.

FIELD OF THE INVENTION

The present invention generally relates to the field of semiconductor devices. More specifically, embodiments of the present invention pertain to control of memory devices.

BACKGROUND

Non-volatile memory (NVM) is increasingly found in applications, such as solid-state hard drives, removable digital picture cards, and so on. Flash memory is the predominant NVM technology in use today. However, flash memory has limitations, such as a relatively high power, as well as relatively slow operation speed. For example, program and erase operations are relatively slow operations, as compared to other operations like read operations. Thus, in some cases these relatively slow operations can be suspended in order to make way for other higher priority operations.

DETAILED DESCRIPTION OF EMBODIMENTS

Figure 1:
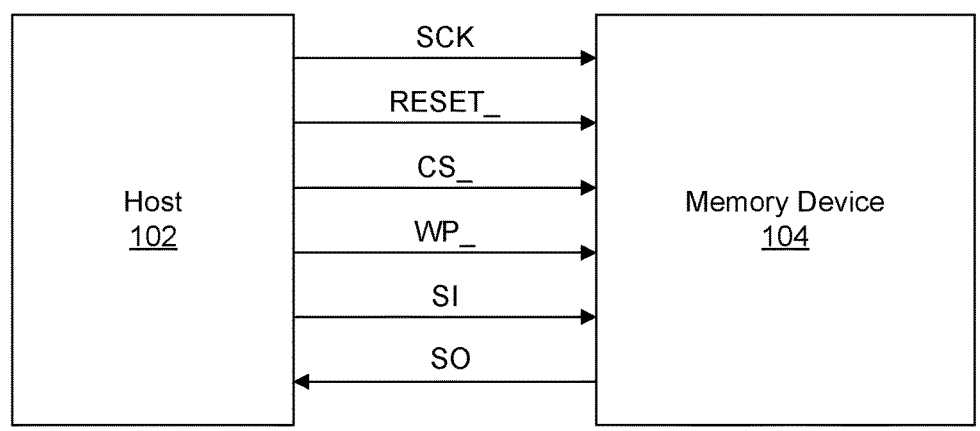
FIG. 1 is a schematic block diagram of an example host and memory device arrangement, in accordance with embodiments of the present invention.

Reference will now be made in detail to particular embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents that may be included within the spirit and scope of the invention as defined by the appended claims. Furthermore, in the following detailed description of the present invention, numerous specific details are set forth in order to provide a thorough understanding of the present invention. However, it will be readily apparent to one skilled in the art that the present invention may be practiced without these specific details. In other instances, well-known methods, procedures, processes, components, structures, and circuits have not been described in detail so as not to unnecessarily obscure aspects of the present invention.

Some portions of the detailed descriptions which follow are presented in terms of processes, procedures, logic blocks, functional blocks, processing, schematic symbols, and/or other symbolic representations of operations on data streams, signals, or waveforms within a computer, processor, controller, device, and/or memory. These descriptions and representations are generally used by those skilled in the data processing arts to effectively convey the substance of their work to others skilled in the art. Usually, though not necessarily, quantities being manipulated take the form of electrical, magnetic, optical, or quantum signals capable of being stored, transferred, combined, compared, and otherwise manipulated in a computer or data processing system. It has proven convenient at times, principally for reasons of common usage, to refer to these signals as bits, waves, waveforms, streams, values, elements, symbols, characters, terms, numbers, or the like.

Particular embodiments may be directed to memory devices, including volatile memory and non-volatile memory (NVM), such as flash memory devices, and/or resistive switching memories (e.g., conductive bridging random-access memory [CBRAM], resistive RAM [ReRAM], etc.). Particular embodiments can include structures and methods of operating flash and/or resistive switching memories that can be written (programmed/erased) between one or more resistance and/or capacitive states. In one example, a CBRAM storage element may be configured such that when a forward or reverse bias greater than a threshold voltage is applied across electrodes of the CBRAM storage element, the electrical properties (e.g., resistance) of the CBRAM storage element can change. In any event, certain embodiments are suitable to any type of memory device, including both volatile and non-volatile types/devices, and that may include resistive switching memory devices.

In one embodiment, a memory device can include: (i) a memory array comprising a plurality of memory cells; (ii) an interface configured to receive a suspend command and first and second write commands from a host, where the second write command is of higher priority and follows the first write command; (iii) a status register configured to store an automatic resume enable bit; (iv) a memory controller configured to suspend, in response to the suspend command, a first write operation that is executing the first write command on the memory array; (v) the memory controller being configured to execute a second write operation on the memory array in response to the second write command; and (vi) the memory controller being configured to resume the first write operation upon completion of the second write operation in response to the automatic resume enable bit being set.

Referring now to FIG. 1, shown is a schematic block diagram 100 of an example host and memory device arrangement, in accordance with embodiments of the present invention. In this example, host 102 can interface with memory device 104 via a serial interface. For example, host 102 can be any suitable controller (e.g., CPU, MCU, general-purpose processor, GPU, DSP, etc.), and memory device 404 can be any type of memory device (e.g., SRAM, DRAM, EEPROM, Flash, CBRAM, magnetic RAM, ReRAM, etc.). Memory device 104 can thus be implemented in a variety of memory technologies, such as non-volatile types. In some cases, memory device 104 can be a serial flash memory that may be implemented in more traditional non-volatile memories, or in CBRAM/ReRAM resistive switching memories.

Various interface signals, such as in a serial peripheral interface (SPI) interface, can be included for communication between host 102 and memory device 104. In this example Single SPI configuration/mode, serial clock (SCK) can provide a clock to device 104, and may be used to control the flow of data to and from the device. Command, address, and input data (e.g., on the SI pin) can be latched on a rising edge of SCK, while output data (e.g., on the SO pin or via I/O pins) can be clocked out on a falling edge of SCK, or by a data strobe in some arrangements. The reset pin (RESET_) can be used to terminate an operation in progress, and to reset an internal state machine of memory device 104 (e.g., to an idle state). Memory device 104 can remain in the reset condition as long as a low level is present on the reset pin. Also, because memory device 104 can include power-on reset circuitry, there may be no restrictions on the reset pin during power-on sequences. In some other implementations, memory device 104 may not include the reset pin (RESET_), and may instead include a hold pin (HOLD_).

Chip select (CS_) can be utilized to select memory device 104, such as from among a plurality of such memory devices, or otherwise as a way to access the device. When the chip select signal is de-asserted (e.g., at a high level), memory device 104 will also be deselected, and may be placed in a standby mode. Activating the chip select signal (e.g., via a high to low transition on CS_) may be utilized to start an operation, and returning the chip select signal to a high state can be utilized for terminating an operation. For internally self-timed operations (e.g., a program or erase cycles), memory device 104 may not enter standby mode until completion of the particular ongoing operation if chip select is de-asserted during the operation. Write protect (WP_) can be utilized for protection of sectors specified for protection by a register (e.g., the sector protection register). For example, such sectors may be protected against program and erase operations. Thus, if a program or erase command is issued to memory device 104 while the write protect pin is asserted, the device may ignore the command and perform no operation.

In this example SPI interface, which may be a "single SPI mode," data can be provided to memory device 104 via a serial input (SI) signal. The serial input can be utilized for data input including command and address sequences. For example, data on the serial input pin can be latched on a rising edge of SCK, and data on the serial input pin can be ignored if the device is deselected (e.g., when the chip select signal is de-asserted). Data can be output from memory device 104 via a serial output (SO) signal. For example, data on the serial output can be clocked out on falling edges of SCK, and the serial output signal can be in a high impedance state when the device is deselected (e.g., when the chip select signal is de-asserted). In particular embodiments, memory device 104 may support a variety of SPI modes or configurations, such as Single SPI, QPI, and Octal modes. Further, the interface mode of memory device 104 can be changed to the Single SPI mode, regardless of the present interface mode, in response to a write command in which automatic entry into a power down mode results after completion thereof.

Figure 2:
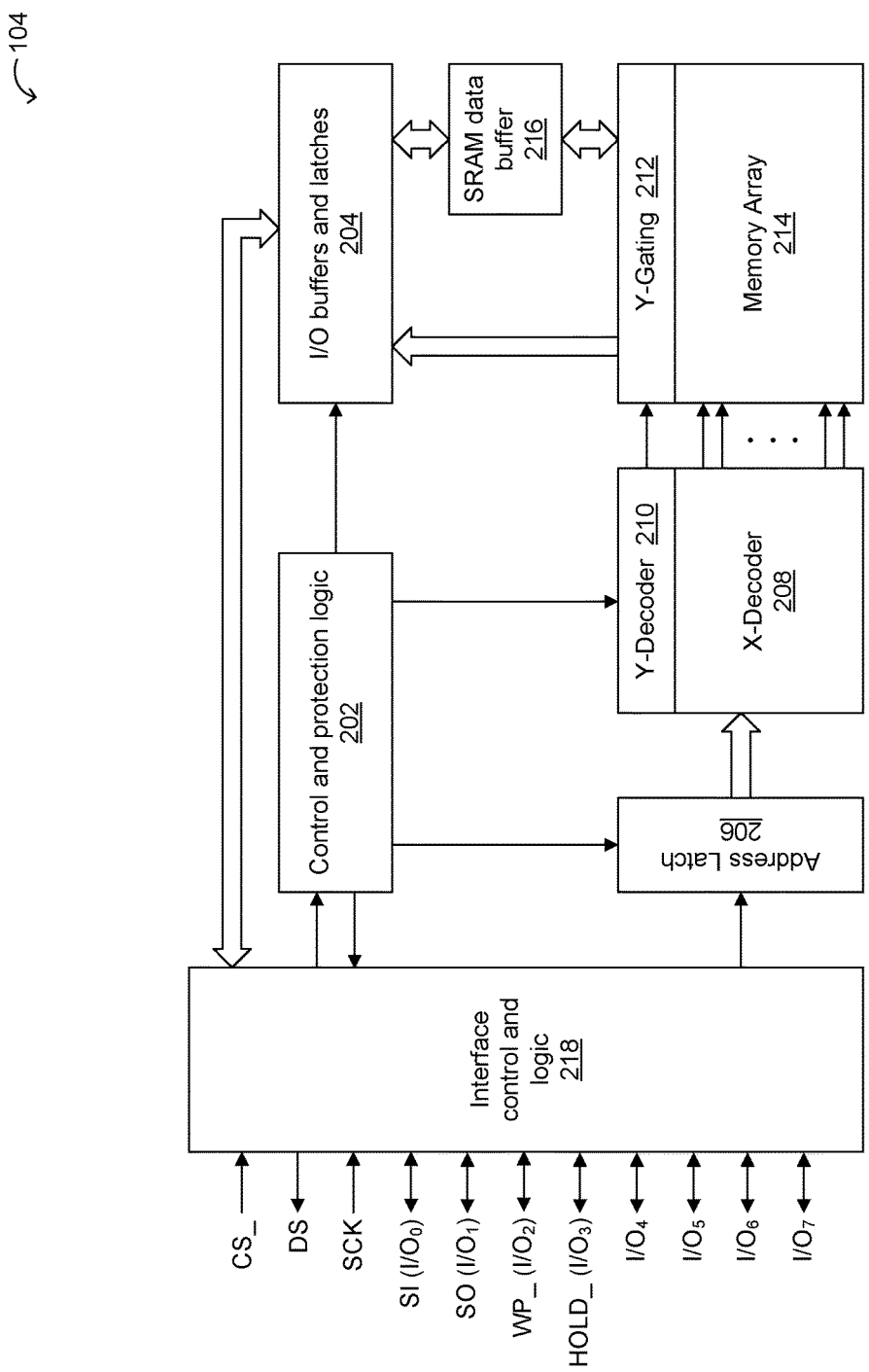
FIG. 2 is a schematic block diagram of an example memory device structure, in accordance with embodiments of the present invention.

Referring now to FIG. 2, shown is a block diagram of an example memory device, in accordance with embodiments of the present invention. Memory device 104 can include interface control and logic 218, which may manage the interface (e.g., SPI interface), and decode the command and address information. Control and protection logic 202 can include control circuitry for reading and writing to memory array 214, including address mapping and control for byte access and group addressing/ordering, as will be discussed in more detail below. For example, control and protection logic 202 can include a command decoder, registers for command execution parameters (e.g., read parameters, program/erase parameters, etc.), as well as a controller for command execution.

I/O buffers and latches 204 can control the input of data from interface control and logic 218, and the output of data to interface control and logic 218. For example, chip select based control and clock based control of data read from memory array 214 can be accommodated via I/O buffers and latches 204. That is, registers/latches in I/O buffers and latches 204 can be controlled by way of the toggling of SCK during burst reads and sequential fetch operations, as described herein. SRAM data buffer(s) 216 can buffer/store data between memory array 214 and I/O buffers and latches 204. Address latch block 206 can receive address information via interface control and logic 218, and may provide latched addresses to X-decoder 208 for row addresses, and to Y-decoder 210 for column addresses. Incrementing of addresses can be performed via address latch block 206 and/or control and protection logic 202. Y-decoder 210 can provide column addresses to Y-Gating 212, which can include pass gates or the like to multiplex I/O lines to/from memory array 214. As discussed above, memory array 214 can include an array of volatile memory cells, or non-volatile memory cells (e.g., CBRAM, ReRAM, Flash, etc.).

Figure 3:
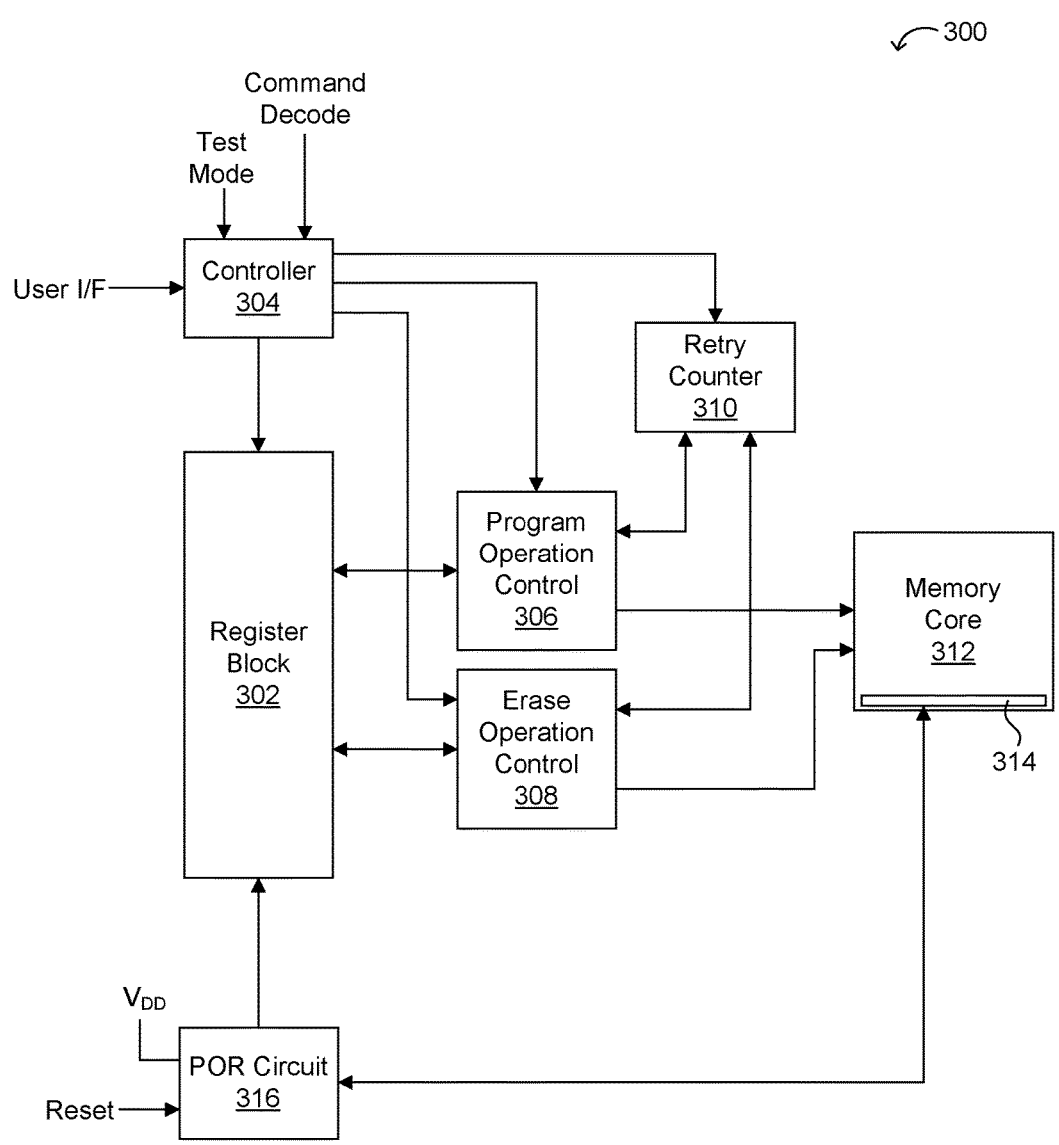
FIG. 3 is a schematic block diagram of an example register and operation control, in accordance with embodiments of the present invention.

Referring now to FIG. 3, shown is a schematic block diagram 300 of an example register and operation control, in accordance with embodiments of the present invention. For example, register block 302 can be implemented using SRAM, and various portions of control blocks and circuits 300 may be included in one or more blocks shown above in FIG. 2. Register block 302 of FIG. 3 can provide algorithm and option variable selections to program operation control 306 and erase operation control 308. Register block 302 can also include a status register that stores an automatic resume enable bit, as well as other configuration and status bits, as will be discussed in more detail below.

Controller 304 may determine and decode commands received by the memory device, and can also control access to the register bits in register block 302. In addition, test modes (e.g., to determine operation distribution, etc.) can be used to override data in register block 302. Settings for register block 302 may be based on various default algorithm and option variable or condition settings, but can also be programmed on lot-by-lot or device-by-device basis. Also, values for program operations, erase operations, and option variable or related condition settings, can be independently programmed in register block 302. POR circuitry 316 may receive a reset signal (e.g., via the RESET_pin), and can access designated register data portion 314 and read out data from that dedicated section of memory array 312. For example, the reset sequence for exiting the UDPD mode can include activating the reset signal.

Memory core/array 312 may be included in memory array 214 of FIG. 2. Designated register data portion 314 may alternatively be located outside of memory core 312. In any event, this accessed data that is associated with memory core 312 may then be loaded into register block 302. In this way, information specific to this device can be programmed into the memory core, and whenever the device is powered on (e.g., as detected by the $V_{DD}$ supply) or otherwise reset, this data can be loaded into register block 302. This is because the memory core, including designated register data portion 314 may include non-volatile memory. Also, different applications-based information can be stored in non-volatile memory designated register data portion 314. Further, different parts or memory cores 312 can be independently programmed (e.g., for different applications, etc.). In some cases, this dedicated portion of memory may not be accessible to the user. However, some applications may allow access to these designated locations, such as in a test mode.

In addition, registers 302 may be programmable by controller 304 and/or by a user via a separate or combined user interface. In this way, a user may be able to program data into registers 302 in order to override or change previous values therein. Particular embodiments may also support independently controlled program/erase algorithm selection for different memory cores 312. For example, controller 304 can set the register values in 302 different for different memory cores 312. For example, register block 302 may include dedicated sectors (e.g., a widened register or increased register bit length) for each memory core, or register block 302 may be replicated for each memory core 312. This may be utilized whereby one memory array 312 is dedicated to one application (e.g., code), while another memory array 312 may be dedicated to another application (e.g., data). In this way, register block 302 may accommodate independently programmable operation algorithms in support of different operations for different memory cores 312. Further, the dedicated sectors in this case can each have their own status register with a corresponding ready bit to indicate if that sector of the memory device is busy with an operation, or in a power down state.

Various program/erase operation algorithms, as well as status (e.g., in a status register), information can be stored in register block 302. For example, at least two bits can be used to indicate which of a predefined group of program algorithms is to be used to execute a program command. Similarly, at least two bits in register block 302 can be used to indicate which of a predefined group of erase algorithms is to be used to execute an erase command. Further, option variables that define conditions (e.g., pulse widths, voltage levels, current levels, etc.) for the program and erase operations of the selected operation algorithm may also be defined in register block 302. In addition, a maximum number of retry attempts, which may be embedded within one or more of the program/erase algorithms may also be stored in register block 302. For example, retry counter 310 may keep track of a number of attempts for a given program or erase operation, or a sequence of program and/or erase operations, as part of a selected program/erase operation algorithm.

Particular embodiments may also support dynamically changing the operation algorithm as the semiconductor device ages, or arrays thereof are cycled more and more. For example, counters may be used to move to different algorithm and/or option variable selections and effectively change the program/erase algorithms to be used based on the counter results. In one example, designated register data portion 314 can be updated to reflect changed algorithm selections, option variables, etc., values based on such counter results. As a result, register block 302 can be updated via POR circuit 316, as discussed above. In another example, incremented values based on the counter results can be dynamically determined based on data output from register block 302. In this case, data that is read from register block 302 can then be updated by subsequent circuitry based on the counter results, before being provided as outputs to program operation control 306 and erase operation control 308.

In particular embodiments, status information in register block 302 can be employed to automatically resume a write operation that was previously suspended. Program and erase operations in NVM devices are typically relatively slow operations, as compared to other operations, such as read operations. In some cases, erases of relatively large memory blocks can take substantial time. It is therefore common to have operations to suspend ongoing write (e.g., program or erase) operations, such that another operation of higher priority may be executed without waiting for the first write operation to finish. In addition, write commands may be nested (e.g., erase during an erase suspend, program during a program suspend), but this may require on-chip circuitry, such as write buffers to be duplicated. In many cases, a program command can be issued during suspension of an erase operation.

In some suspend/resume commands, the host controller (e.g., 102) may have to remain awake in order to monitor the process ongoing on the memory device (e.g., 104). For instance, if an erase operation is in progress on the memory device, and the system needs to store a page of data by way of a new write operation, the host controller can issue a suspend command to the memory device. The host controller can then read the status register (e.g., from register block 302) in order to verify that the memory device is in erase suspend and is otherwise ready, and then may issue a program command in order transfer all the data to be written. For example, the status register can include a ready/busy bit that indicates whether the device is busy with a given operation, or is ready (e.g., in a standby mode) to accept a new command. The host may then have to wait until the program operation has finished (e.g., using active status interrupt) before the host can finally send a resume command in order to direct the memory device to continue the erase operation that was suspended earlier.

In particular embodiments, an automatic resume can occur after a new program or erase operation, whereby the memory device, after finishing the write operation that was started during the suspend, can automatically resume the write operation that was suspended. Further, this automatic resume capability can be enabled by an automatic resume enable bit that may be programmed in the status register of register block 302. For the host controller, the automatic resume functionality can essentially allow for a "fire-and-forget" operation, instead of having to wait for what may turn out to be several hundred thousand CPU operations in some cases. Thus, the CPU/host may promptly go to sleep, or perform other tasks instead of waiting. In this way, the memory device can automatically take care of the resume operation without further intervention from the host controller.

Automatic resume after write functionality may be enabled by setting a bit in a status/control register of register block 302. This bit may be volatile or non-volatile, and may be set or cleared before the first erase operation (e.g., to be suspended) is started. Alternatively, the automatic resume enable bit may be set or cleared during the suspend, such as prior to the (last) write operation, which can be part of a series of nested write operations, has begun. As such, more than one write command can be issued during a suspend, and the user/host may set the automatic resume enable bit prior to the last write command being received at the memory device.

In one embodiment, a method of controlling a memory device can include: (i) receiving, by an interface, a suspend command and first and second write commands from a host, where the second write command is of higher priority and follows the first write command; (ii) storing an automatic resume enable bit in a status register on the memory device; (iii) suspending a first write operation that is executing the first write command on the memory array in response to the suspend command; (iv) executing a second write operation on the memory array in response to the second write command; and (v) resuming the first write operation upon completion of the second write operation in response to the automatic resume enable bit being set.

Figure 4:
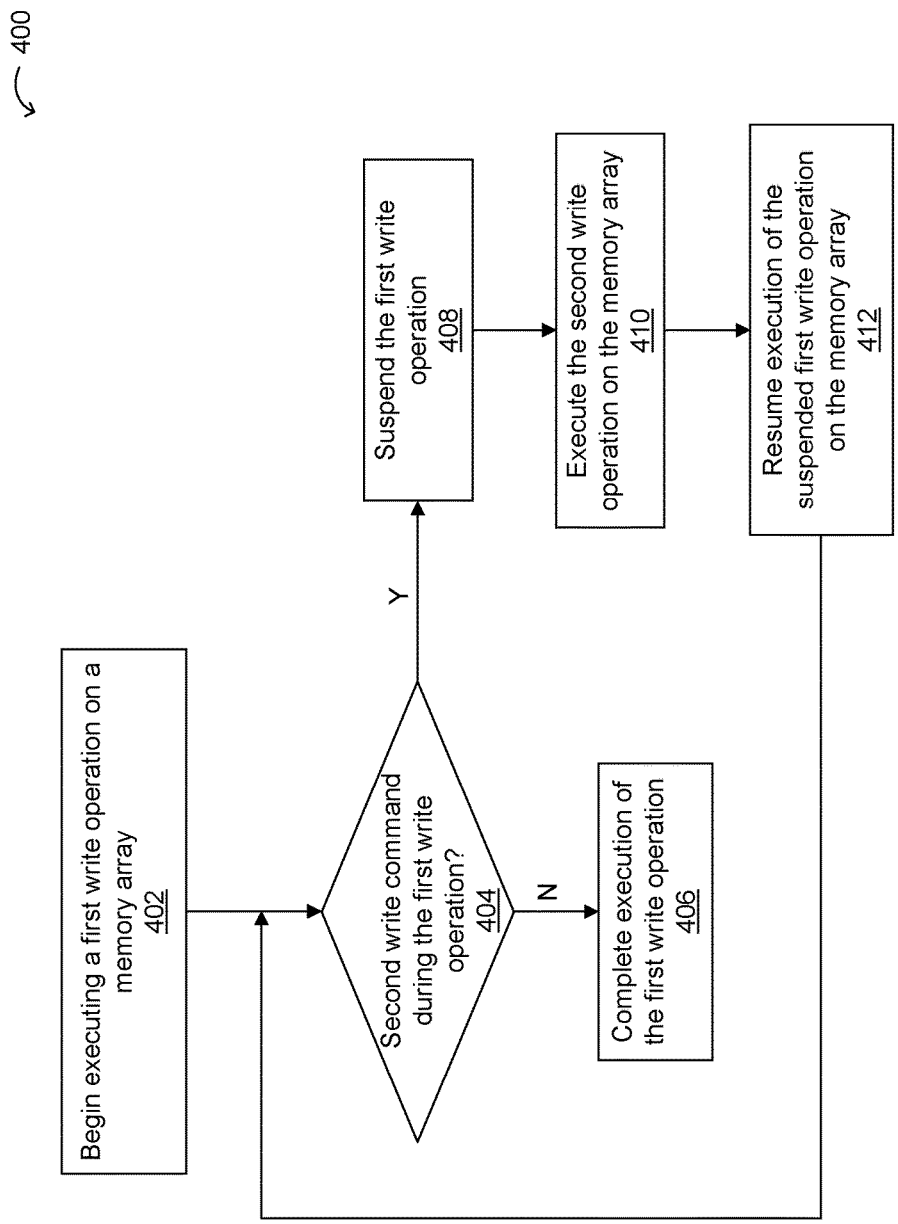
FIG. 4 is a flow diagram of an example method of controlling multiple write operations in a memory device, in accordance with embodiments of the present invention.

Referring now to FIG. 4, shown is a flow diagram of an example method 400 of controlling multiple write operations in a memory device, in accordance with embodiments of the present invention. At 402, a first write operation (e.g., program or erase operation) can begin execution on a memory array (e.g., 214) in response to a write command from the host. If at 404, no other higher priority commands (e.g., a second write operation) occur during the first write operation, execution of the first write operation can complete on the memory array at 406. In this case, there is no suspension of the write operation.

However, if at 404, a second write operation occurs during the first write operation, the first write operation can be suspended at 408. This second operation being provided by the host can be a higher priority than the first write operation. In order to suspend the first write operation, an explicit suspend command can be employed to suspend the first write operation prior to the command for the second write operation being received by the memory device. In another example, the second write command being issued during the first write operation can automatically result in the first write operation being suspended. At 410, the second write operation can be executed on the memory array. At 412, execution of the suspended first write operation can be resumed. For example, resumption of the first write operation can occur in response to an automatic resume enable bit being set in the status register (e.g., in 302). As another example, resumption of the first write operation can occur in response to an explicit resume command being issued from the host.

Particular embodiments may also support various reduced power modes. For example, an ultra-deep power down (UDPD) mode can substantially reduce the supply current of the memory device. The memory device may enter the UDPD mode based on an explicit command, or as part of an automatic entry upon completion of a given operation. For example, SPI memory (e.g., slave) devices may require the user to issue a specific command (e.g., DP, UDPD) in order to make the memory device enter a low power state. In this case, the host may issue a command including opcode 79h in order to effectively force the memory device into the low power UDPD state. A supply current ($I_{CC}$) of the memory device when in the UDPD mode may be less than a supply current of the memory device when in the standby mode. Also, the active current, such as when the memory devices in a program or erase operation, can be higher than the supply current of the memory device when in a standby operation. Thus, the UDPD mode or state may effectively be a "sleep" state whereby the memory device is in its lowest power and least active state. Further, other low-power modes, such as deep power down modes may fall between the standby mode and the UDPD mode in terms of supply current.

In particular embodiments, an automatic UDPD mode entry can occur upon completion of a write (program or erase) operation, which may allow the memory device to further reduce its energy consumption by automatically entering the UDPD mode at the earliest feasible time. As described herein, the write operation can be any program or erase operation on the memory device, such as including block or chip erase commands, byte/page program commands, or buffer to main memory page program without built-in erase commands, just to name a few. However, strictly buffer write or register write commands may not cause the memory device to go into UDPD mode as described herein. In certain embodiments, the automatic UDPD (AUDPD) mode after program/erase operation can be enabled by setting an AUDPD configuration bit in a status register (e.g., in register block 302) on the memory device. In addition, the AUDPD configuration bit may be cleared once the memory device goes into the UDPD, such that the AUDPD configuration bit may be set again if another write operation followed by AUDPD mode entry is desired.

Figure 5:
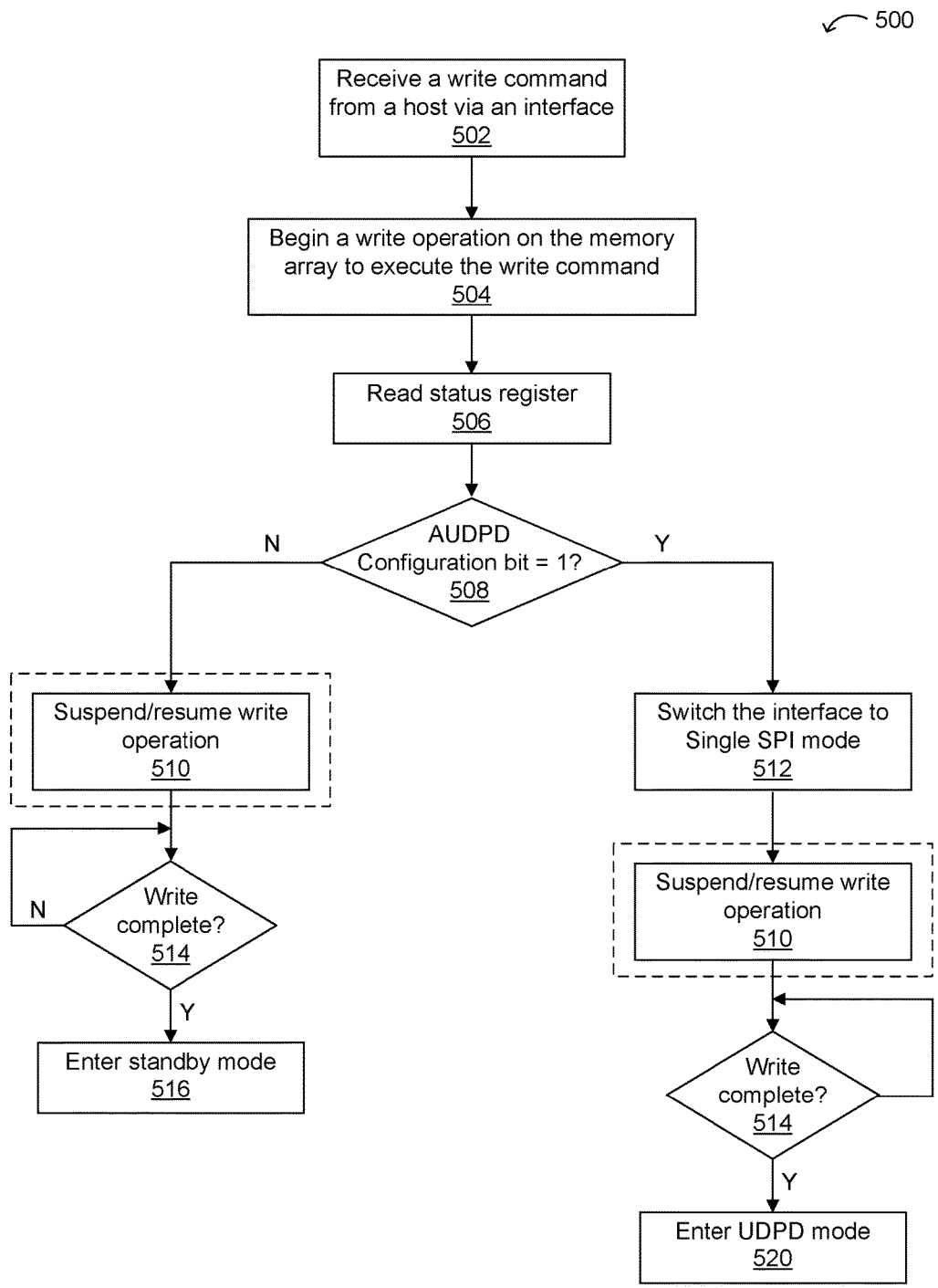
FIG. 5 is a flow diagram of an example method of controlling multiple write operations and automatic UDPD mode entry in a memory device, in accordance with embodiments of the present invention.

Referring now to FIG. 5, shown is a flow diagram of an example method 500 of controlling multiple write operations and automatic UDPD mode entry in a memory device, in accordance with embodiments of the present invention. In particular embodiments, the automatic resume after program or erase functionality may also be combined with automatic power down mode entry (e.g., AUDPD or ADPD). The AUDPD or ADPD operation in this case may also be suspended by the suspend operation, such the memory device may not go to sleep until after finishing a write operation that was started during suspend. It may only be after finishing the first program or erase operation (the operation that was suspended) that the memory device may go to sleep as part of the power down mode.

At 502, a write command can be received in the memory device from a host via an interface (e.g., SPI). At 504, a write operation can begin on the memory device in order to execute that write command. For example, the "write operation" can include one or more program and/or erase pulses, such as with a predetermined write algorithm. At 506, a status register on the memory device can be read. In particular, an auto-UDPD (AUDPD) configuration bit state can be determined from the status register. Thus, both AUDPD configuration and automatic resume enable bits can be accessed from the status register, and used to determine both automatic resumption and automatic power down mode entry on the memory device.

At 508, if the AUDPD configuration bit is cleared (e.g., state="0"), the write operation may be suspended/resumed at 510. It should be noted that block 510, which will be discussed in more detail below with respect to FIG. 6, may only occur if subsequent (e.g., higher priority) operations occur during the write operation. Once the write operation has completed at 514, the device can enter the standby mode at 516. Thus in this case, the memory device may be ready to accept new commands without entering the UDPD state. However, at 508, if the AUDPD configuration bit is set (e.g., state="1"), the interface may be switched to a single SPI mode at 512, and the write operation may be suspended/resumed as necessary at 510. Once the write operation has completed at 514, the device can automatically enter the UDPD mode at 520. Thus in particular embodiments, the UDPD mode can automatically be entered upon completion of the write operation in response to the AUDPD configuration bit being set on the memory device.

In this way, a configuration bit, which may be referred to as an AUDPD configuration bit, as designated in the memory device status register, can be utilized to control UDPD mode entry in an automatic fashion. In addition, the user and/or host device may have the ability to set or to clear this AUDPD configuration bit, and this can be done prior to the issuance of any write command to the memory device. In certain embodiments, if the master/host issues a write command with the AUDPD configuration bit on the memory device being in its cleared state (e.g., "0"), the memory device can complete the internally timed write operation, and then may automatically enter the standby state upon completion of the write operation.

However, if the master/host issues a write command with the AUDPD configuration bit in its set state (e.g., "1"), the memory device can complete the write operation, and may then automatically enter into the UDPD mode upon completion of the internally timed write operation. In this way, the master/host can therefore enter its own low power sleep state sooner, and without having to wait for the slave memory device to complete the ongoing write operation. Once the host device issues a write command with the AUDPD configuration bit set, the host device can immediately enter its own sleep state as desired because there is no need to wait for the write operation to complete or to send another command to explicitly put the memory device in the UDPD mode. In one example, if the master device wishes to write a series of pages of data to the memory device, the master/host can initially clear the AUDPD configuration bit, and then may issue the page write commands. Prior to the last page write command being issued, the master/host can set the AUDPD configuration bit, and then issue the last page write command of the series. In this case, the memory device may only enter the UDPD mode in an automatic fashion after the last such page write operation.

In addition, once the memory device enters into the UDPD mode, the master/host device can wake up the slave memory device by using any suitable exit or reset operation, in order to return the memory device to it standby state (e.g., ready to accept new commands). Further, when the master/host device wakes up from its own sleep state and wishes to determine the state of the slave memory device, the host device can issue a read status register (RDSR) command to the memory device to determine the device state. However, in some cases, once the memory device enters the UDPD mode, the memory device may not accept any commands from the host other than the exit UDPD operation command, in order to maximize the power savings during this low power sleep state. As will be discussed in more detail below, particular embodiments also provide an approach that allows the memory device to convey to the host device that it is in the UDPD state.

Figure 6:
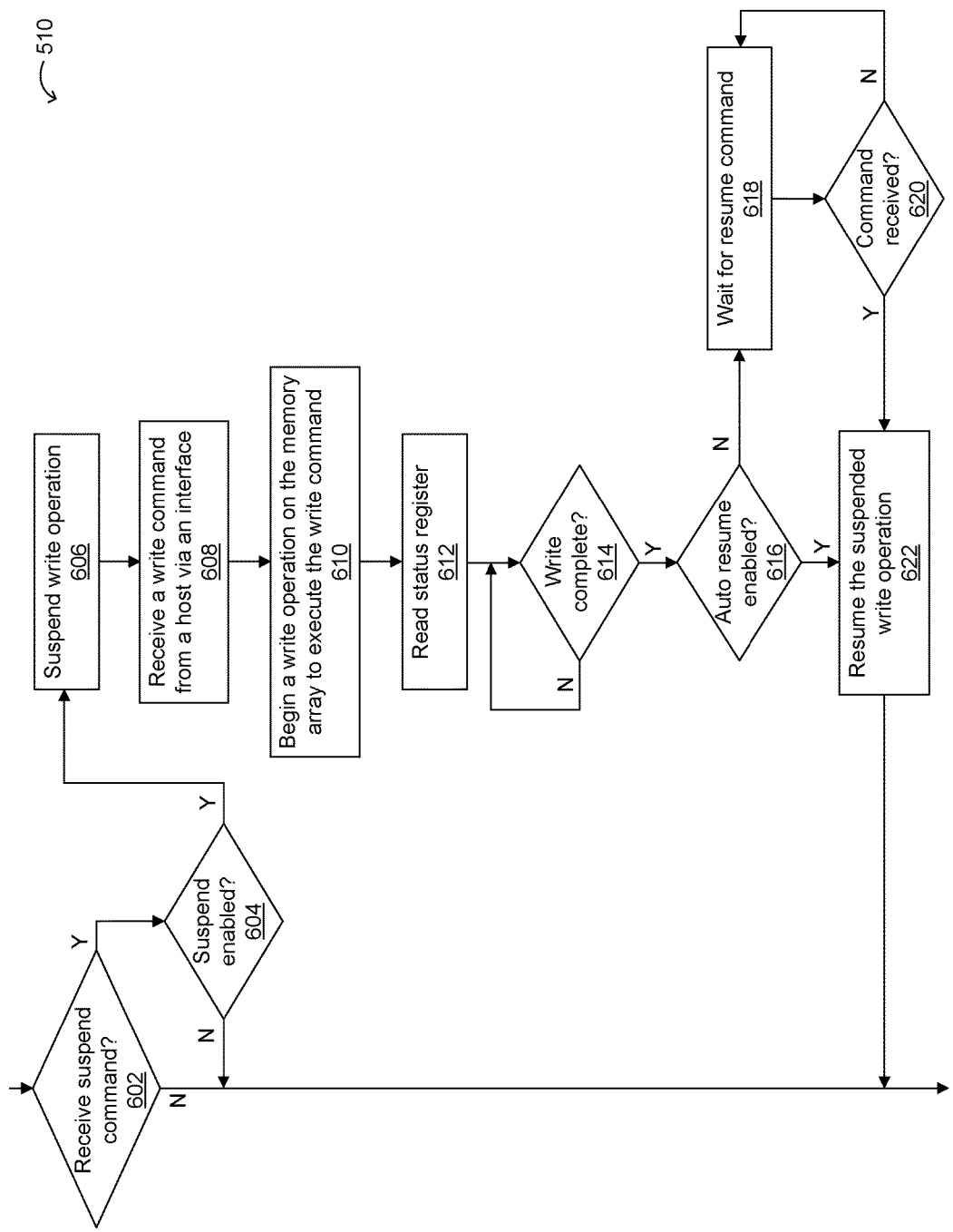
FIG. 6 is a flow diagram of an example method of controlling suspension and resumption of write operations in a memory device, in accordance with embodiments of the present invention.

Referring now to FIG. 6, shown is a flow diagram of an example method of controlling suspension and resumption of write operations in a memory device, in accordance with embodiments of the present invention. This diagram shows an example of the suspend/resumed write operation 510 that is shown above in FIG. 5. In 510, if a suspend command is received at 602, and suspend is enabled at 604, the write operation can be suspended at 606. For example, the suspend command can be received from a host device 102, and the suspend operation itself may be enabled by way of a dedicated bit in the status register, and/or if the suspend command is valid when received.

At 608, a (second) write command can be received from the host via the interface. In some examples, this write command at 608 can be any other higher priority command (e.g., a read command, etc.). Thus, the first command received after the suspend does not have to be a write command; however, a second write command is primarily described herein. At 610, the write operation corresponding to the write command at 608 can begin execution on the memory array. At 612, the status register can be read in order to determine via a ready/busy bit therein whether the write operation has completed. In addition, the status register read can indicate whether the automatic resume enable bit has been set (to enable automatic operation resumption) or cleared (to disable automatic operation resumption).

At 614, if the write operation has completed, and if at 616 the automatic resume enable bit has been set, then the suspended write operation can be resumed at 622. If the automatic resume bit/functionality has not been enabled at 616, then the memory device may wait for an explicit resume command from the host at 618. Once the resume command has been received at 620, the suspended write operation can be resumed at 622. Thus as shown, the previously suspended write operation can automatically be resumed by the memory device without an explicit command from the host device in response to the automatic resume enable bit of the status register being set. Otherwise, an explicit resume command may be received from the host device in order to resume this previously suspended command when the automatic resume enable bit of the status register is cleared.

Figure 7:
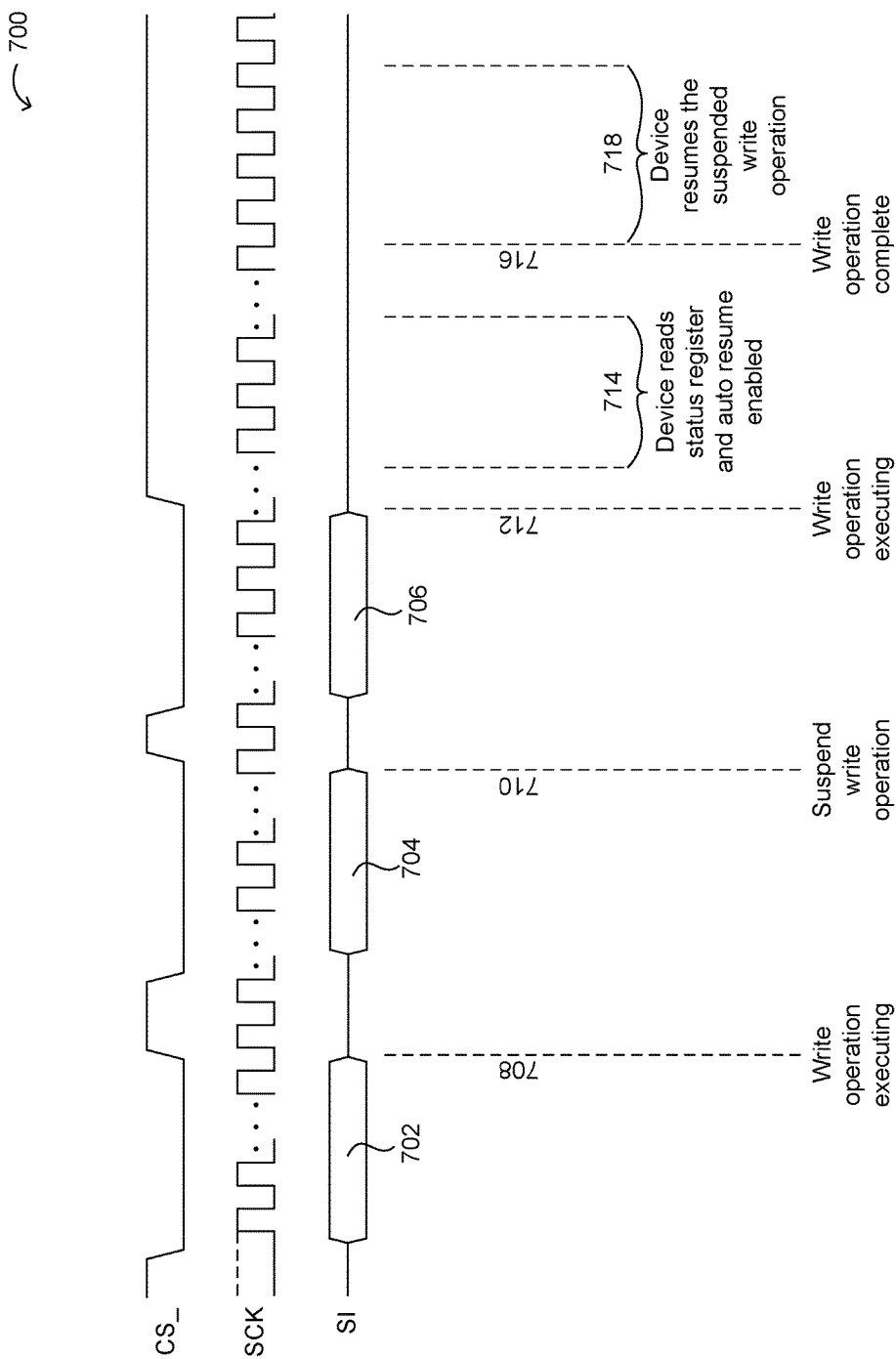
FIG. 7 is a waveform diagram of example operation of suspension and resumption of write operations in a memory device, in accordance with embodiments of the present invention.

Referring now to FIG. 7, shown is a waveform diagram of example operation of suspension and resumption of write operations in a memory device, in accordance with embodiments of the present invention. In the example 700, a first write command can be issued by the host at 702, and may include an opcode that indicates the particular type of write operation (e.g., program, erase, etc.), page write operations, and/or data to be written. This write operation can begin execution at some point once the command has been received and/or sufficiently decoded, such as at 708. At some point during execution of this write operation, a suspend command can be issued by the host at 704. As a result, this first write operation can be suspended by the memory device, such as at 710.

At 706, a second (e.g., higher priority) write command can be issued by the host device. As a result, a corresponding second write operation can be executed on the memory device, such as beginning at 712. The memory device can determine the state of the automatic resume enable bit by reading the status register during 714, which can occur during the second write operation to execute write command 706. If the automatic resume enable bit is cleared, the memory device can return to a standby state upon completing the second write operation. However, if the automatic resume enable bit is set, the memory device can automatically resume 718 (e.g., without an explicit command from the host) execution of the first write operation (e.g., corresponding to write command 702) upon completion of the second write operation at 716.

In this way, particular embodiments can free up CPU/host operations by automatically resuming previously suspended write operations in response to an enable bit found in the memory device status register. While the above examples include circuit, operational, and structural implementations of certain memory arrangements and devices, one skilled in the art will recognize that other technologies and/or structures can be used in accordance with embodiments. Further, one skilled in the art will recognize that other device circuit or block arrangements, architectures, elements, and the like, may also be used in accordance with embodiments.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the claims appended hereto and their equivalents.

What is claimed is:

1. A memory device, comprising:
   a) a memory array comprising a plurality of memory cells;
   b) an interface configured to receive a suspend command and first and second write commands from a host, wherein the second write command is of higher priority and follows the first write command;
   c) a status register configured to store an automatic resume enable bit;
   d) a memory controller configured to suspend, in response to the suspend command, a first write operation that is executing the first write command on the memory array;
   e) the memory controller being configured to execute a second write operation on the memory array in response to the second write command; and
   f) the memory controller being configured to resume the first write operation upon completion of the second write operation in response to the automatic resume enable bit being set.

2. The memory device of claim 1, wherein the status register further comprises a ready/busy indicator bit that is set when an operation has completed on the memory device.

3. The memory device of claim 2, wherein the ready/busy indicator bit is set upon completion of the second write operation.

4. The memory device of claim 1, wherein the status register further comprises an automatic ultra-deep power-down (UDPD) configuration bit.

5. The memory device of claim 4, being configured to enter a standby mode upon completion of the first write operation in response to the UDPD configuration bit being cleared.

6. The memory device of claim 4, being configured to enter an UDPD mode upon completion of the first write operation in response to the UDPD configuration bit being set.

7. The memory device of claim 4, wherein the interface is switched to a single serial peripheral interface (SPI) mode prior to the suspension of the first write operation in response to the UDPD configuration bit being set.

8. The memory device of claim 1, wherein the automatic resume enable bit is stored in the status register during the suspension of the first write operation.

9. The memory device of claim 1, wherein the automatic resume enable bit is stored in the status register prior to beginning the second write operation.

10. The memory device of claim 1, wherein each of the first and second write operations comprises a plurality of write pulses in order to program or erase at least one of the plurality of memory cells.

* * * * *